(12) United States Patent
Butail et al.

(10) Patent No.: US 11,864,372 B2
(45) Date of Patent: Jan. 2, 2024

(54) LINE BENDING CONTROL FOR MEMORY APPLICATIONS

(71) Applicant: LAM RESEARCH CORPORATION, Fremont, CA (US)

(72) Inventors: Gorun Butail, Fremont, CA (US); Shruti Thombare, Sunnyvale, CA (US); Ishtak Karim, San Jose, CA (US); Patrick Van Cleemput, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 270 days.

(21) Appl. No.: 17/297,710

(22) PCT Filed: Nov. 25, 2019

(86) PCT No.: PCT/US2019/062965
§ 371 (c)(1),
(2) Date: May 27, 2021

(87) PCT Pub. No.: WO2020/112616
PCT Pub. Date: Jun. 4, 2020

(65) Prior Publication Data
US 2022/0028864 A1 Jan. 27, 2022

Related U.S. Application Data

(60) Provisional application No. 62/773,689, filed on Nov. 30, 2018.

(51) Int. Cl.
*H10B 12/00* (2023.01)
(52) U.S. Cl.
CPC ........... *H10B 12/053* (2023.02); *H10B 12/34* (2023.02)

(58) Field of Classification Search
None
See application file for complete search history.

(56) References Cited

U.S. PATENT DOCUMENTS

| 10,573,522 B2 * | 2/2020 | Jandl ................. H01L 21/76879 |
| 2014/0030889 A1 | 1/2014 | Chen et al. |
| 2014/0106083 A1 | 4/2014 | Wu et al. |
| 2016/0118345 A1 | 4/2016 | Chen et al. |
| 2018/0053660 A1 | 2/2018 | Jandl et al. |

FOREIGN PATENT DOCUMENTS

WO    WO-2016085569 A1    6/2016

OTHER PUBLICATIONS

International Search Report and Written Opinion of the ISA issued in PCT/US2019/062965, dated Mar. 13, 2020; ISA/KR.

* cited by examiner

*Primary Examiner* — Hsien Ming Lee

(57) ABSTRACT

A method for reducing bending of word lines in a memory cell includes a) providing a substrate including a plurality of word lines arranged adjacent to one another and above a plurality of transistors; b) depositing a layer of film on the plurality of word lines using a deposition process; c) after depositing the layer of film, measuring word line bending; d) comparing the word line bending to a predetermined range; e) based on the word line bending, adjusting at least one of nucleation delay and grain size of the deposition process; and f) repeating b) to e) one or more times using one or more substrates, respectively, until the word line bending is within the predetermined range.

22 Claims, 8 Drawing Sheets

LINE BENDING CONTROL FOR MEMORY APPLICATIONS

CROSS-REFERENCE TO RELATED APPLICATIONS

This application is a U.S. National Phase Application under 35 U.S.C. 371 of International Application No. PCT/US2019/062965, filed on Nov. 25, 2019, which claims the benefit of U.S. Provisional Application No. 62/773,689, filed on Nov. 30, 2018. The entire disclosures of the applications referenced above are incorporated herein by reference.

FIELD

The present disclosure relates to substrate processing systems, and more particularly to methods for controlling line bending in memory applications.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Electronic devices such as laptops, tablets, smartphones, etc. include memory such as dynamic random access memory (DRAM) or vertical NAND (VNAND) memory. The memory is typically implemented by an integrated circuit (IC) including memory cells. As electronic devices shrink in size and use more data, the cost, density and access speed of the memory cells become increasingly important. As a result, feature sizes have decreased significantly and aspect ratios have increased.

Substrate processing systems for performing deposition and/or etching on a substrate such as a semiconductor wafer typically include a processing chamber with a pedestal. The substrate is arranged on the pedestal during processing. A process gas mixture including one or more precursors may be introduced into the processing chamber to deposit a layer on the substrate or to etch the substrate. In some substrate processing systems, radio frequency (RF) plasma can be struck in the processing chamber and/or an RF bias on the pedestal may be used to activate chemical reactions.

SUMMARY

A method for reducing bending of word lines in a memory cell includes a) providing a substrate including a plurality of word lines arranged adjacent to one another and above a plurality of transistors; b) depositing a layer of film on the plurality of word lines using a deposition process; c) after depositing the layer of film, measuring word line bending; d) comparing the word line bending to a predetermined range; e) based on the word line bending, adjusting at least one of nucleation delay and grain size of the deposition process; and f) repeating b) to e) one or more times using one or more substrates, respectively, until the word line bending is within the predetermined range.

In other features, (e) includes adjusting at least one of temperature and pressure of the deposition process to adjust the nucleation delay. The layer of film is selected from a group consisting of molybdenum, tungsten, ruthenium and cobalt.

In other features, the method includes arranging a liner layer between the plurality of word lines and the layer of film. The liner layer includes titanium nitride. The temperature of the deposition process is adjusted in e). The pressure of the deposition process is adjusted in e). The temperature and the pressure of the deposition process is adjusted in e). The temperature of the deposition process is decreased in e) to increase the nucleation delay. The pressure of the deposition process is decreased in e) to increase the nucleation delay. The temperature and the pressure of the deposition process are decreased in e) to increase the nucleation delay.

In other features, (e) includes increasing the nucleation delay if the word line bending is greater than the predetermined range. In other features, (e) includes decreasing the nucleation delay if the word line bending is less than the predetermined range.

In other features, (e) includes using an inhibitor species to adjust the nucleation delay. The inhibition species is selected from a group consisting of molecular nitrogen and ammonia. A concentration of the inhibitor species is increased in (e) to increase the nucleation delay. An exposure time of the inhibition species is increased in (e) to increase the nucleation delay. A concentration and an exposure time of the inhibitor species are increased in (e) to increase the nucleation delay.

In other features, (e) includes adjusting precursor chemistry or changing a mixture of precursors to adjust the nucleation delay. In other features, (e) includes using at least one of temperature and pressure to control grain size.

In other features, (e) includes using impurities to control grain size. In other features, (e) includes using insitu gases to control grain size and film roughness.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The substrate processing system can be used to fabricate integrated circuits such as memory including a plurality of memory cells. As aspect ratios increase and critical dimensions shrink, problems may arise during fabrication. For example, high aspect ratio features such as word lines in VNAND and DRAM memory cells may experience bending during deposition of film on the word lines. The bending can cause a variety of problems such as alignment of the word lines with respect to other features, performance variations and/or other defects.

The present disclosure relates to a method for reducing bending of high aspect ratio features of a substrate during deposition of film. For example, the method may be used to reduce bending of adjacent word lines in memory cells such as VNAND and DRAM. The line bending occurs due to stress during film deposition (metal/dielectric) and cohesive forces of the materials.

The method includes modulating the nucleation delay of the deposition process to control word line bending. For example, the method includes selecting process parameters for deposition of the film. The process parameters such as temperature and pressure are typically optimized to provide a smooth film with small grain size and low nucleation delay. However, with small feature sizes and high aspect ratios, line bending occurs when smooth film is deposited.

The method according to the present disclosure includes selecting deposition process parameters, depositing the film and measuring line bending. In some examples, if the line bending is outside of a predetermined range, the temperature and/or pressure are adjusted (e.g. reduced) to increase nucleation delay and grain size to provide a rougher film. In some examples, the temperature is adjusted in a range from 300° C. to 700° C. In some examples, the pressure is adjusted in a range from 5 Torr to 80 Torr.

Deposition of the film in this manner reduces line bending at the expense of fill. The deposition process is run again with new temperature and pressure values and line bending is measured. The process is repeated until the line bending is within the predetermined tolerance. In some examples, the method according to the present disclosure can significantly reduce line bending of word lines in memory devices such as VNAND and DRAM memory cells.

Figure 1:
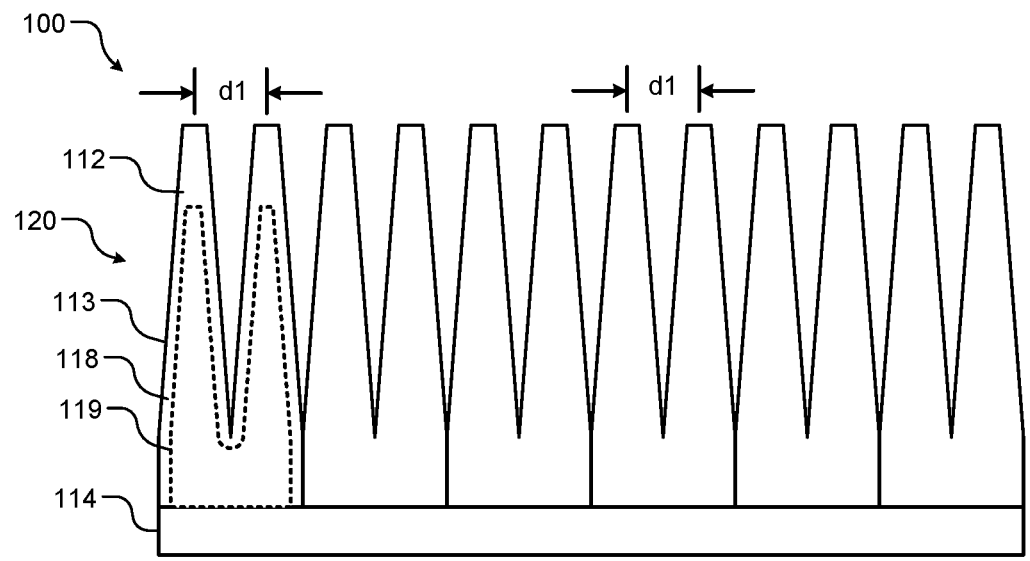
FIGS. 1 to 5 are side cross-sectional views of an example of a substrate including word lines of a memory cell, deposition of a layer over the word lines and bending of the word lines.

Referring now to FIGS. 1 to 5, an example of word line bending during deposition of a layer is shown. In FIG. 1, a substrate 100 includes an underlying layer 114 (including transistors) and a plurality of word lines 112. In some examples, the plurality of word lines 112 is part of memory cells such as a DRAM memory cells, which include a capacitor and a transistor. The plurality of word lines provides a connection to gates of the transistors. The plurality of word lines 112 controls the flow of current in a channel of the transistors. In some examples, a liner layer 113 is arranged on the plurality of word lines 112 as a barrier layer before the metal deposition. For example only, the liner layer 113 may be made of titanium nitride (TiN), In some examples, the plurality of word lines 112 may include an outer layer 118 made of dielectric such as $SiO_2$ and an inner layer made of a material 119 such as silicon (Si) (as shown in dotted lines of adjacent word lines 120 in FIG. 1 but omitted elsewhere for clarity), although other arrangements may be used.

The spacing between the plurality of word lines 112 is predefined. For example, the plurality of word lines 112 may be fabricated with uniform spacing d1 between the plurality of word lines 112. In other examples, different spacing can be defined between some of the plurality of word lines 112. Usually it is desirable to maintain the predefined spacing between the plurality of word lines 112 after additional processing is performed to maintain alignment with other features, to prevent shorting and/or to maintain performance parameters such as resistance and/or capacitance.

Figure 2:
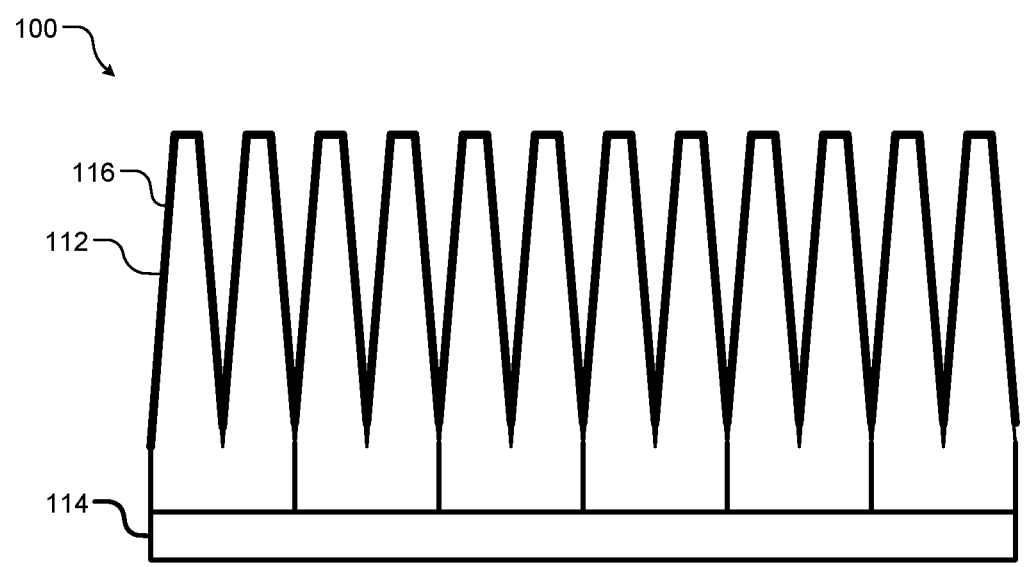

In FIG. 2, a layer 116 is deposited to fill a gap between the plurality of word lines 112. In some examples, the layer 116 includes tungsten (W), ruthenium (Ru), cobalt (Co), or molybdenum (Mo). In some examples, the liner layer 113 and the layer 116 are deposited using atomic layer deposition (ALD). In other examples, chemical vapor deposition (CVD) or other deposition process is used. In some examples, plasma may be used to enhance chemical reactions during deposition. In some examples, the deposition process parameters for the layer 116 are selected to produce the following characteristics: the layer 116 is conformal and has low nucleation delay and a small grain size. In other words, it is usually desirable to have a smooth film deposited on the plurality of word lines 112 rather than a rougher film. In some examples, one or more liner layers may be deposited between the layer 116 and the plurality of word lines 112.

Figure 3:
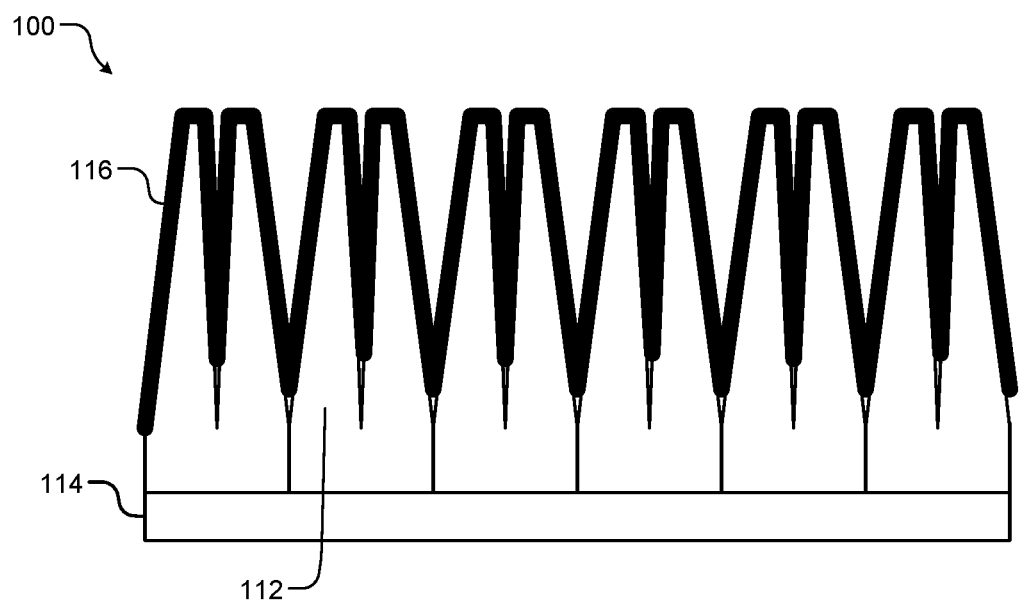
Figure 4:
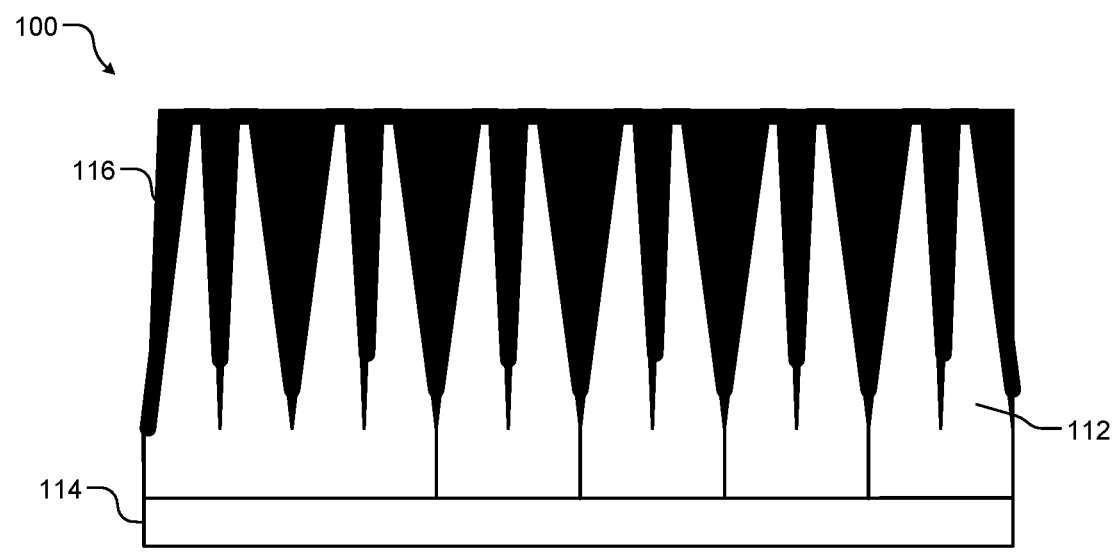

In FIG. 3, as the layer 116 is deposited with these characteristics, line bending may occur. Some of the plurality of word lines 112 bend towards an adjacent one of the plurality of word lines 112 and others of the plurality of word lines 112 bend away from an adjacent one of the plurality of word lines 112. As a result, the predefined spacing is no longer maintained. In FIG. 4, additional deposition is performed to fill the gaps between the plurality of word lines 112.

Figure 5:
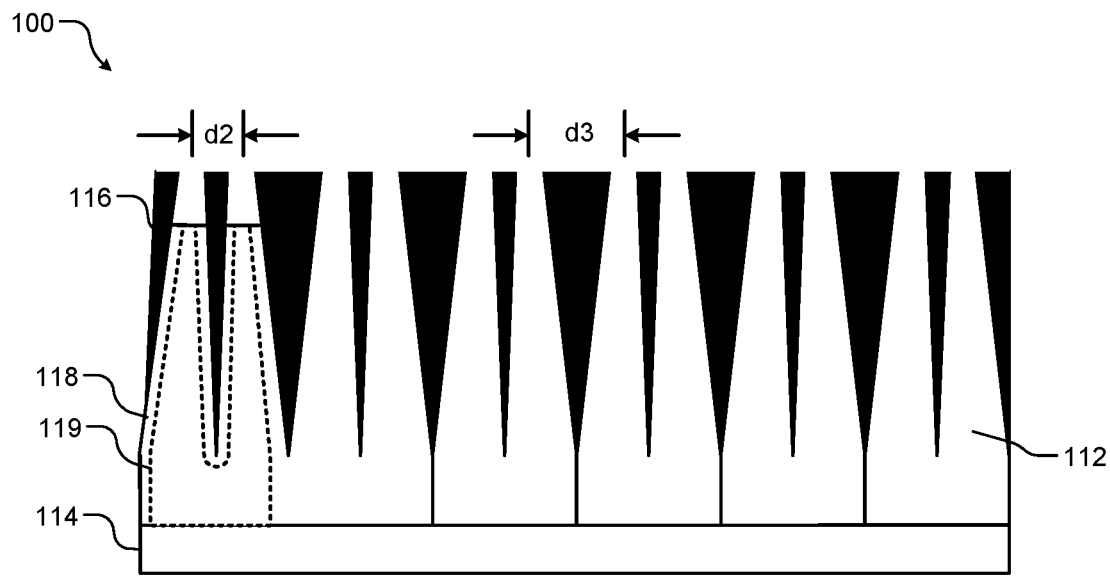

In FIG. 5, etching and/or other processes may be performed to expose upper surfaces of the plurality of word lines 112 and/or a top surface of the material 119 (to allow contact). Additional layers (not shown) are deposited and contact the material 119. As can be seen, distances d2 and d3 between adjacent ones of the plurality of word lines 112 are different than each other and different than d1. When the additional layers are deposited, misalignment can occur. Additionally, performance parameters such as resistance and capacitance can be adversely affected by the variations in spacing between the plurality of word lines 112.

Figure 6:
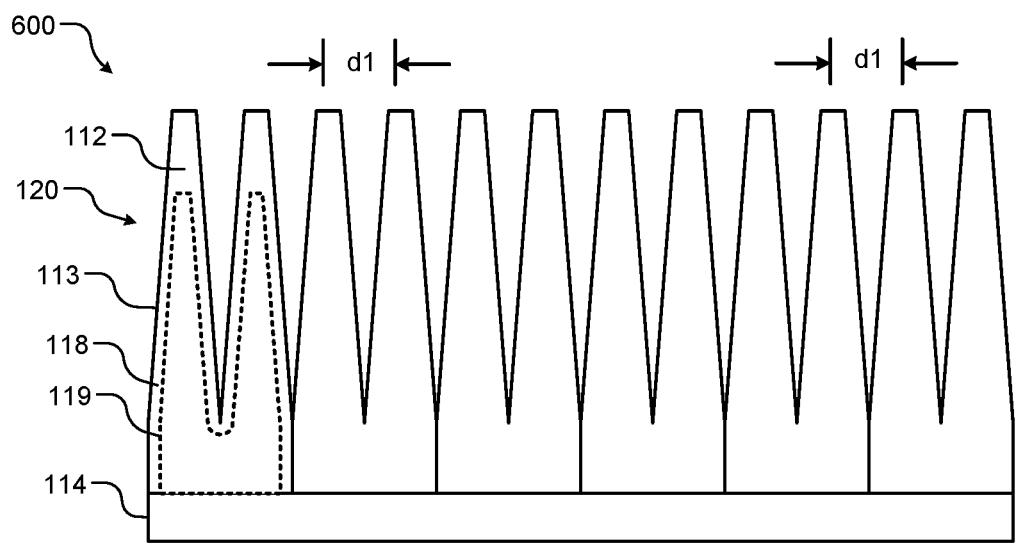
FIGS. 6 to 10 are side cross-sectional views of an example of a substrate including word lines of a memory cell and deposition of a layer over the word lines with significantly reduced bending of the word lines according to the present disclosure.

Referring now to FIGS. 6 to 10, an example of a method for reducing word line bending during deposition of a layer is shown. In FIG. 6, a substrate 600 includes an underlying layer 114 and a plurality of word lines 112. The spacing between the plurality of word lines 112 is predefined. For example, the plurality of word lines 112 is fabricated with uniform spacing d1 between the plurality of word lines 112. In other examples, different spacing can be defined between some of the plurality of word lines 112. Usually it is desirable to maintain the predefined spacing between the plurality of word lines 112 after additional processing is performed to maintain alignment with other features, to prevent shorting and/or to maintain performance parameters such as resistance and/or capacitance.

Figure 7:
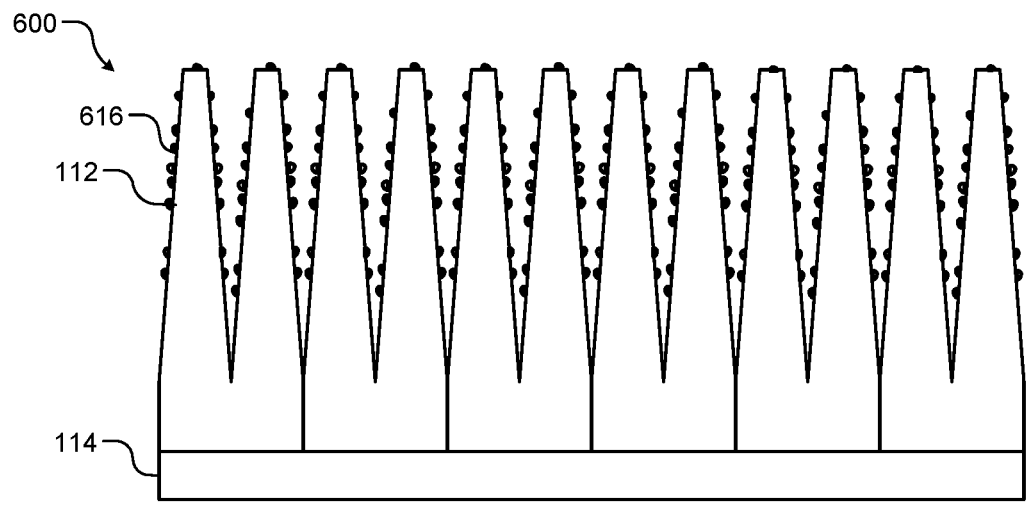

In FIG. 7, a layer 616 is deposited to fill a gap between the plurality of word lines 112. In some examples, the layer 616 is deposited using atomic layer deposition (ALD), chemical vapor deposition (CVD) or other deposition process. In some examples, plasma may be used to enhance chemical reactions during deposition. In some examples, the deposition process parameters for the layer 616 are selected to produce the following characteristics: the layer 616 is conformal and has high nucleation delay and a large grain size. As will be described further below, depositing film using high nucleation delay and the large grain size will result in rougher film characteristics but will prevent line bending. In other words, the method described herein goes against the usual goal of depositing a smooth film on the plurality of word lines 112.

Figure 8:
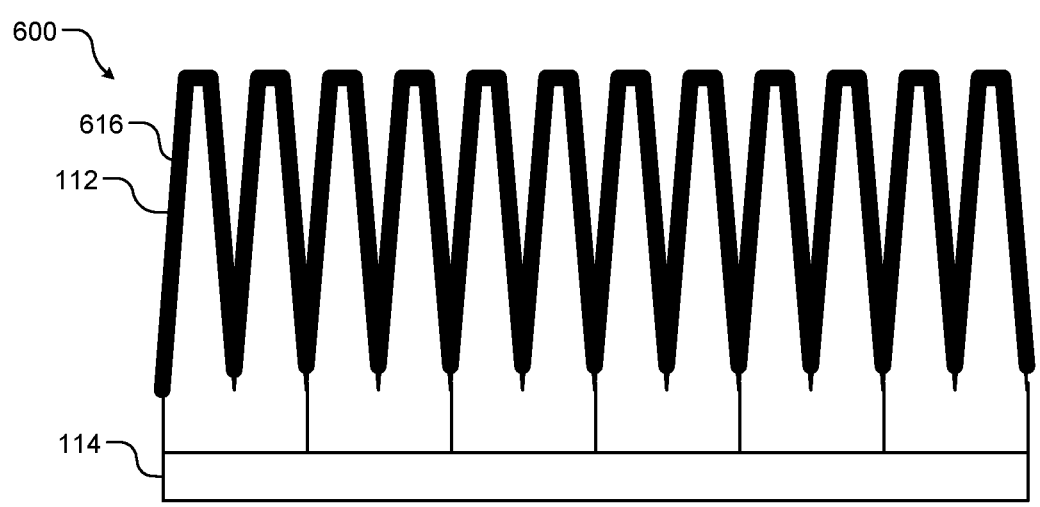
Figure 9:
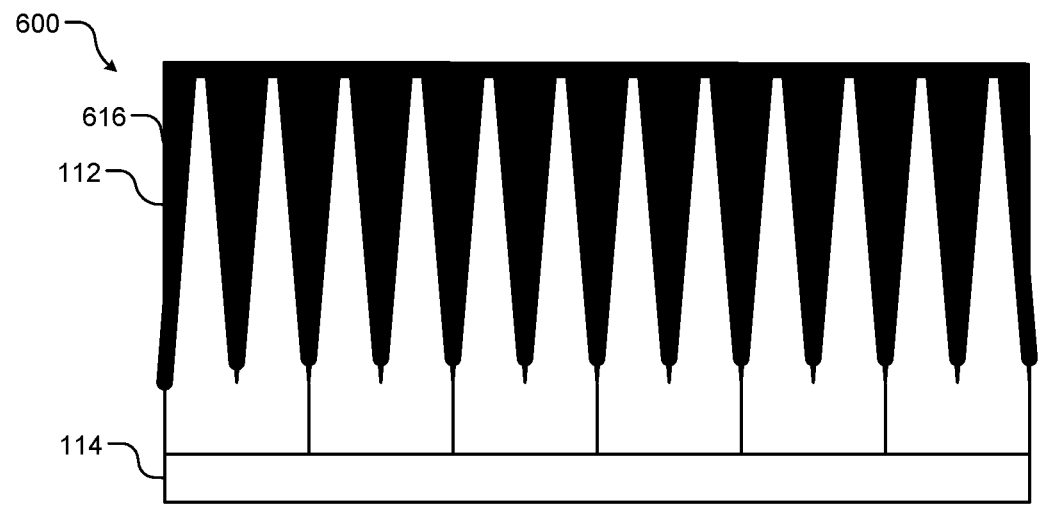

In FIG. 8, as the layer 616 is deposited with these characteristics, line bending is reduced significantly. In FIG. 9, additional deposition is performed to fill the gaps between the plurality of word lines 112.

Figure 10:
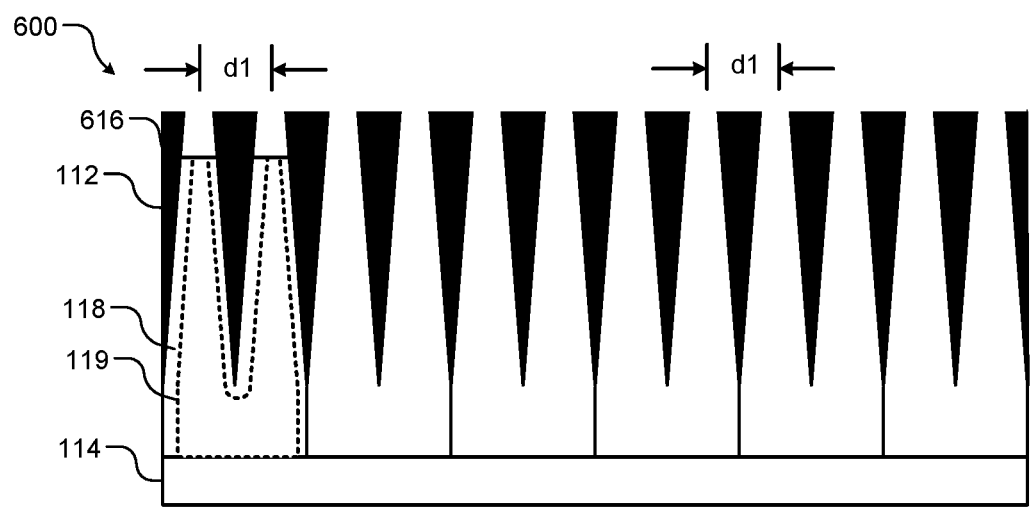

In FIG. 10, etching and/or another process may be performed to expose upper surfaces of the plurality of word lines 112. As can be seen in FIG. 10, additional layers (not shown) can be deposited on an upper surface 1010 and may require alignment with top surfaces of the material 119. As can be seen, the predefined distance (e.g. d1 in this example) between adjacent ones of the plurality of word lines 112 is maintained. Therefore, substantial alignment can be maintained when the additional layers are deposited. Additionally, performance parameters such as resistance and capacitance are not adversely affected by the variations in spacing between the plurality of word lines 112 (as in FIGS. 1 to 5).

Figure 11:
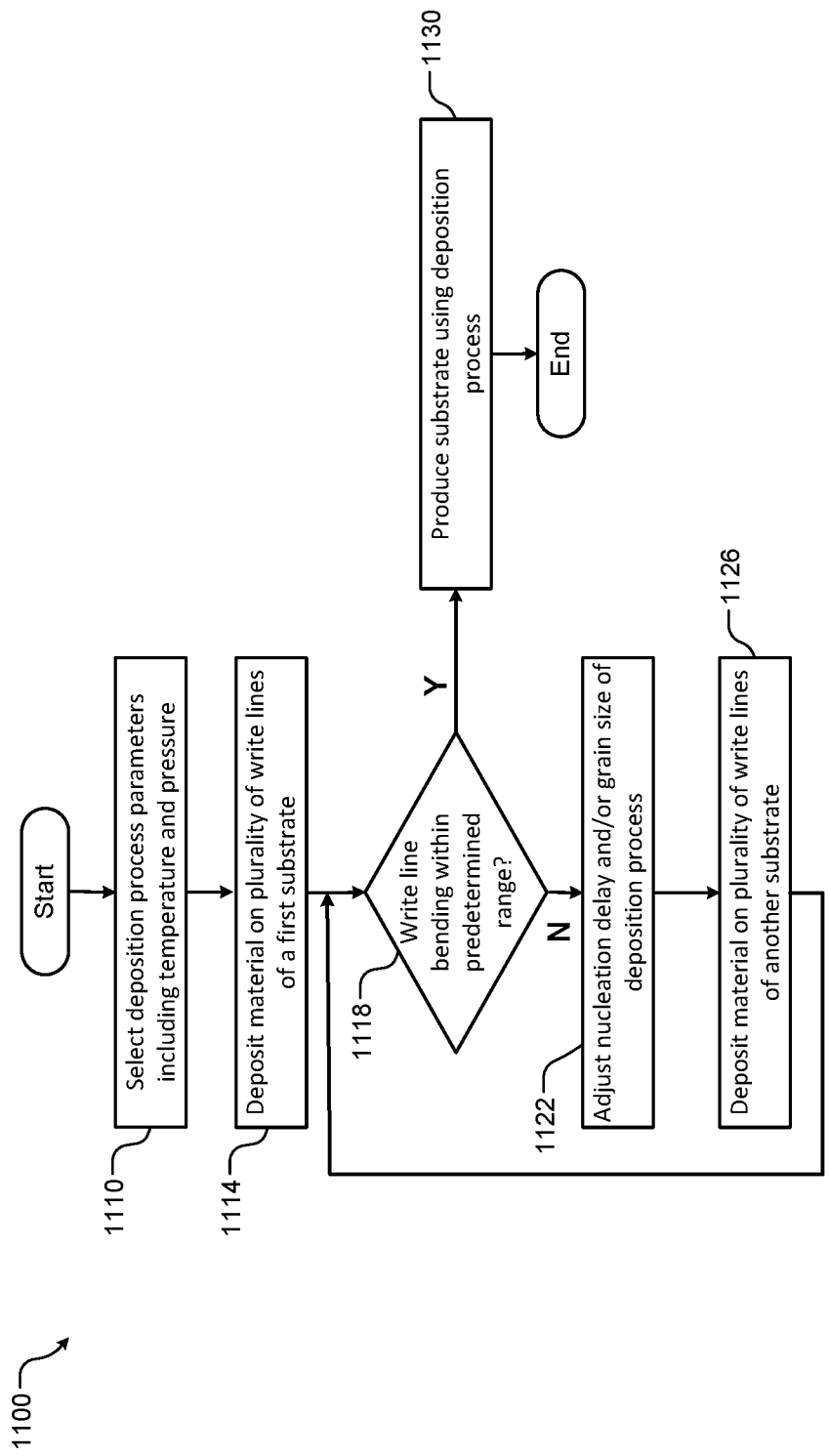
FIG. 11 is a flowchart of an example of a method for reducing bending of word lines when depositing a layer on the word lines.

Referring now to FIG. 11, a method 1100 for reducing bending of a feature such as word lines when depositing a layer on the feature is shown. The method 1100 includes selecting process parameters for deposition of the film at 1110. The process parameters such as temperature and pressure are typically optimized to provide a smooth film with small grain size and low nucleation delay. However, with small feature sizes and high aspect ratios, line bending occurs when smooth film is deposited.

After selecting process parameters, the method includes depositing the film at 1114. At 1118, line bending is measured and compared to a predetermined range. If the line bending is outside of the predetermined range as determined at 1118, the nucleation delay and/or grain size are adjusted. In some examples, the temperature or pressure used during deposition are varied as described herein although other methods are described below.

For example when the line bending is higher than the predetermined range, the pressure and/or temperature are decreased. The process is run again at 1126 with the adjustment. The method returns to 1118 and line bending is measured again. The process may be repeated one or more times until the line bending is within the predetermined range as determined at 1118. In other words, balancing of film roughness and line bending may be optimized. When 1118 is true, the process is used for producing substrates.

Figure 12A:
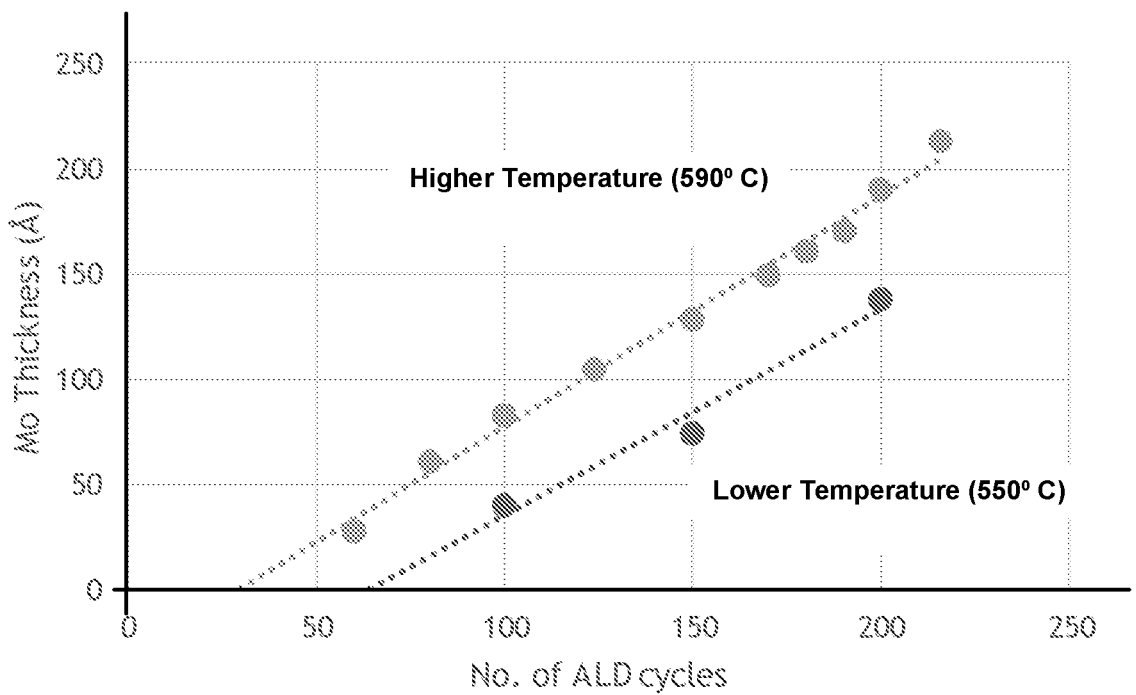
FIG. 12A is a graph illustrating molybdenum thickness as a function of ALD cycles for different temperatures.
Figure 12B:
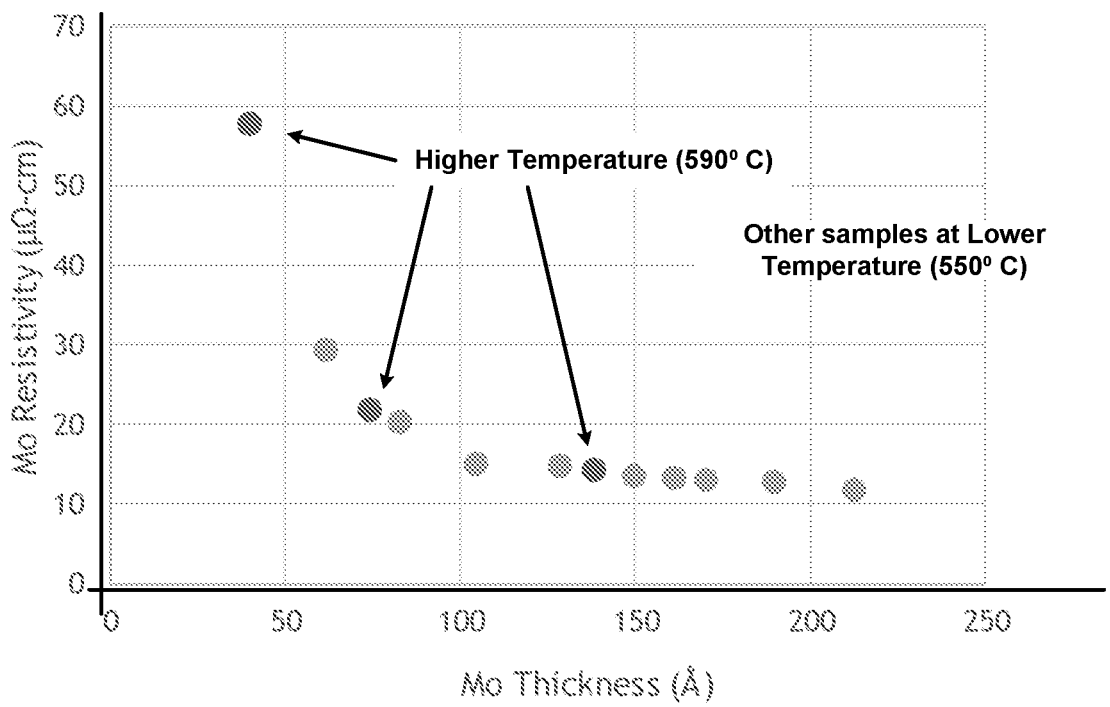
FIG. 12B is a graph illustrating molybdenum resistivity as a function of thickness at different temperatures.

Referring now to FIGS. 12A and 12B, lowering the temperature during deposition increases nucleation delay, grain size and roughness of the film. As a result, the word line bending is reduced. In FIG. 12A, a graph illustrates molybdenum thickness as a function of ALD cycles for different temperatures. In this example, the higher temperature corresponds to 590° C. and the lower temperature corresponds to 550° C. As can be seen, the nucleation delay for the lower temperature is increased relative to the higher temperature (in this example from about 33 ALD cycles to about 62 ALD cycles). The grain size and roughness of the film also increases. In some examples, the word line bending decreases from 9.6 nm to 1.7 nm. In FIG. 12B, a graph illustrates molybdenum resistivity as a function of thickness at different temperatures. The different temperatures have approximately the same resistance.

Figure 13A:
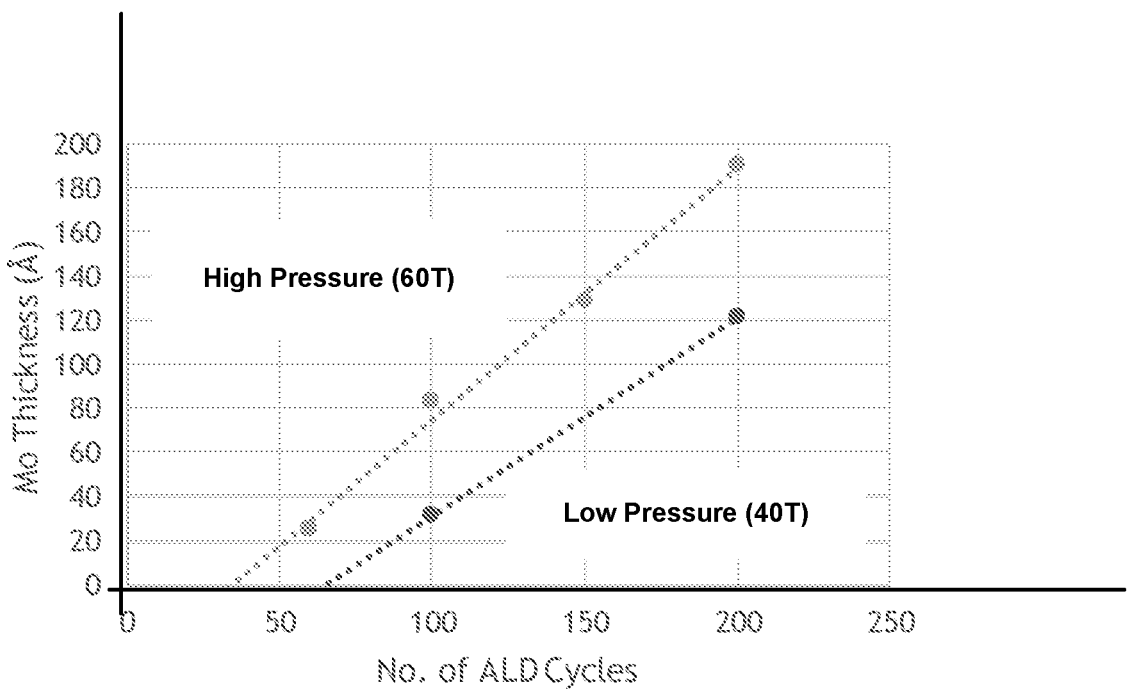
FIG. 13A is a graph illustrating molybdenum thickness as a function of ALD cycles for different pressures.
Figure 13B:
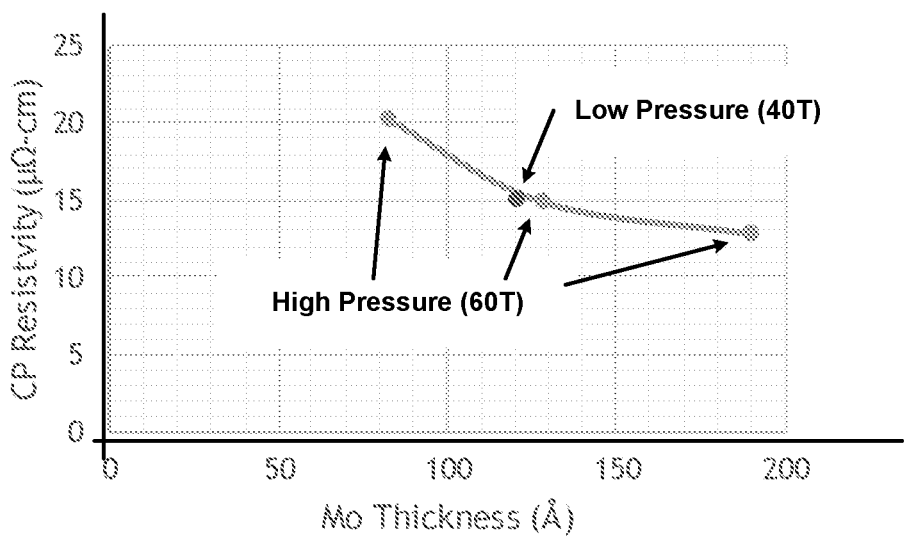
FIG. 13B is a graph illustrating molybdenum resistivity as a function of thickness at different pressures.

Referring now to FIGS. 13A and 13B, lowering the pressure during deposition increases nucleation delay, grain size and roughness of the film. As a result, the word line bending is reduced. In FIG. 13A, a graph illustrates molybdenum thickness as a function of ALD cycles for different pressures. In this example, the higher pressure corresponds to 60 Torr and the lower pressure corresponds to 40 Torr. As can be seen, the nucleation delay for the lower pressure is increased relative to the higher pressure (in this example from about 39 ALD cycles to about 59 ALD cycles). The grain size and roughness of the film also increases. In some examples, the word line bending decreases from 9.9 nm to 1.6 nm. In FIG. 13B, a graph illustrates molybdenum resistivity as a function of thickness at different pressures. The different pressures have approximately the same resistance.

As can be appreciated, a combination of temperature and pressure changes can be used to increase nucleation delay, grain size and roughness and reduce line bending.

While examples set forth above describe modulating the nucleation delay by varying temperature and/or pressure, there are other ways to modulate nucleation delay. For example, the nucleation delay can be modulated by selecting a different deposition process (atomic layer deposition (ALD), chemical vapor deposition (CVD) or plasma enhanced (PE) ALD), selecting a different conductor (molybdenum (Mo), tungsten (W), ruthenium (Ru), or cobalt (Co) or different precursors for the conducting layer, introducing impurities before deposition or during deposition to alter grain size or nucleation delay, or using a surface treatment such as molecular nitrogen ($N_2$ or ammonia ($NH_3$)) prior to deposition. The surface treatment may include the use of plasma.

When using an ALD process, precursor molecules need to chemically adsorb to the surface before film growth can be initiated. The surface comprises finite nucleation sites to which the precursor molecules can adsorb. When these sites are competitively blocked with molecules that can also adsorb to the surface but minimally interact with the precursor molecules, the sites are no longer available for precursor adsorption.

By varying the concentration of the inhibitor molecules, nucleation delay and consequently film roughness and line bending can be controlled. Small nitrogen containing molecules such as molecular nitrogen ($N_2$) or ammonia ($NH_3$) may be effective inhibitors. In other examples, larger nitrogen containing molecules such as hydrazine or organic hydrazines can be used. The larger molecules are more potent as an inhibitor due to the additional effect of steric hindrance.

Some examples described above start with a smooth film and decrease the temperature and/or pressure until the desired line bending threshold is reached. In other examples, the method can be performed initially with a rougher film and the temperature and/or pressure can be increased until the desired amount of line bending is reached. In other words, a desired tradeoff between line bending and roughness can be determined from either direction smooth to rough or rough to less rough. For example, a predetermined threshold range can be used. The word line bending is compared to the predetermined threshold range. If the word line bending is less than the predetermined threshold range, then nucleation delay is decreased until the word line bending is in the predetermined threshold range. If the word line bending is greater than the predetermined threshold range, then nucleation delay is increased until the word line bending is in the predetermined threshold range.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A method for reducing bending of word lines in a memory cell, comprising:
   a) providing a substrate including a plurality of word lines arranged adjacent to one another and above a plurality of transistors;
   b) depositing a layer of film on the plurality of word lines using a deposition process;
   c) after depositing the layer of film, measuring word line bending;
   d) comparing the word line bending to a threshold tolerance range;
   e) based on the word line bending, adjusting at least one of nucleation delay and grain size of the deposition process; and
   f) repeating b) to e) one or more times using one or more substrates, respectively, until the word line bending is within the threshold tolerance range.
2. The method of claim 1, wherein (e) includes adjusting at least one of temperature and pressure of the deposition process to adjust the nucleation delay.
3. The method of claim 2, wherein the temperature of the deposition process is adjusted in e).
4. The method of claim 2, wherein the pressure of the deposition process is adjusted in e).
5. The method of claim 2, wherein the temperature and the pressure of the deposition process are adjusted in e).
6. The method of claim 2, wherein the temperature of the deposition process is decreased in e) to increase the nucleation delay.
7. The method of claim 2, wherein the pressure of the deposition process is decreased in e) to increase the nucleation delay.
8. The method of claim 2, wherein the temperature and the pressure of the deposition process are decreased in e) to increase the nucleation delay.
9. The method of claim 1, wherein the layer of film is selected from a group consisting of molybdenum, tungsten, ruthenium and cobalt.
10. The method of claim 1, further comprising arranging a liner layer between the plurality of word lines and the layer of film.
11. The method of claim 10, wherein the liner layer includes titanium nitride.
12. The method of claim 1, wherein (e) includes increasing the nucleation delay if the word line bending is greater than the threshold tolerance range.
13. The method of claim 1, wherein (e) includes decreasing the nucleation delay if the word line bending is less than the threshold tolerance range.
14. The method of claim 1, wherein (e) includes using an inhibitor species to adjust the nucleation delay.
15. The method of claim 14, wherein the inhibition species is selected from a group consisting of molecular nitrogen and ammonia.
16. The method of claim 14, wherein a concentration of the inhibitor species is increased in (e) to increase the nucleation delay.
17. The method of claim 14, wherein an exposure time of the inhibition species is increased in (e) to increase the nucleation delay.
18. The method of claim 14, wherein a concentration and an exposure time of the inhibitor species are increased in (e) to increase the nucleation delay.
19. The method of claim 1, wherein (e) includes adjusting precursor chemistry or changing a mixture of precursors to adjust the nucleation delay.
20. The method of claim 1, wherein (e) includes using at least one of temperature and pressure to control grain size.
21. The method of claim 1, wherein (e) includes using impurities to control grain size.
22. The method of claim 1, wherein (e) includes using insitu gases to control grain size and film roughness.

* * * * *